United States Patent
Desai et al.

(10) Patent No.: US 10,861,559 B1
(45) Date of Patent: Dec. 8, 2020

(54) CONTROLLED STRING ERASE FOR NONVOLATILE MEMORY

(71) Applicant: SanDisk Technologies LLC, Addison, TX (US)

(72) Inventors: Amul Desai, Milpitas, CA (US); Jayavel Pachamuthu, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/722,322

(22) Filed: Dec. 20, 2019

(51) Int. Cl.
| | |
|---|---|
| *G11C 16/16* | (2006.01) |
| *G11C 16/08* | (2006.01) |
| *H01L 29/78* | (2006.01) |
| *G11C 8/12* | (2006.01) |
| *H01L 27/11529* | (2017.01) |
| *G11C 16/12* | (2006.01) |

(52) U.S. Cl.
CPC ............. *G11C 16/16* (2013.01); *G11C 8/12* (2013.01); *G11C 16/08* (2013.01); *G11C 16/12* (2013.01); *H01L 27/11529* (2013.01); *H01L 29/7827* (2013.01)

(58) Field of Classification Search
None
See application file for complete search history.

(56) References Cited

U.S. PATENT DOCUMENTS

| | | | | |
|---|---|---|---|---|
| 8,259,499 B2 * | 9/2012 | Chang | ................ | G11C 16/0483 365/185.11 |
| 8,339,861 B2 * | 12/2012 | Chang | ................ | G11C 16/3477 365/185.22 |

* cited by examiner

*Primary Examiner* — Tan T. Nguyen
(74) *Attorney, Agent, or Firm* — Dickinson Wright PLLC; Steven Hurles (57) ABSTRACT

A methodology and structure for selectively erases a group of strings in a vertical NAND memory array to account for the slow to erase memory cells in the inner strands compared to the outer strands in the group. Erase signals can be applied through both the drain side connections and the source side connections in a first step to erase the outer strings. A second erase signal can be applied to the inner strands to erase the inner strands. The second signal can be applied from just the drain side connections or through both the drain side connections and the source side connections. In another embodiment, the erase signals are applied from both the source side connections and the drain side connections to the inner strings and only from the source side connections to the outer strings.

18 Claims, 11 Drawing Sheets

CONTROLLED STRING ERASE FOR NONVOLATILE MEMORY

TECHNICAL FIELD

This disclosure relates to memory systems and methods, and in particular, to memory methods and systems with controlled erase functions for nonvolatile memories and erasing for multi-tiered data storage architectures.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory. It is desired to reduce the feature size and place additional features in a same footprint. However, the addition of additional features and the reduction in size creates limitations on performance, including the ability to reliably erase memory cells.

SUMMARY

This disclosure relates generally to memory systems and methods which can apply different erase signals to the inner strands relative to the erase signals applied to outer strands of a grouping of strands.

An aspect of the disclosed embodiments include a nonvolatile memory, e.g., a NAND memory, method that includes the step of erasing inner strings and outer strings of a group of strings from both a source side and a drain side of the strings. The method further includes the step of end erasing inner strings and outer strings. The method proceeds with the step of erasing inner strings of the group of strings from the drain side to complete erase of the group of strings.

In another aspect of the present invention, the method includes the step of energizing inner strings and outer strings of a string group of a source side. The method further includes the step of energizing inner strings of the string group of a drain side such that during an erase time period, the inner strings are erased from energy from both the source side and the drain side. The method proceeds with the step of ending erase of both the inner strings and the outer strings to complete an erase cycle for both the inner strings and the outer strings.

In another aspect of the present disclosure, a NAND memory is provided. The memory includes a group of inner strings and outer strings, each with a direct strap contact for a source line. The memory also includes control circuitry to supply erase signals to erase memory cells in the group of inner and outer strings. The control circuitry is configured to apply different erase signals to the inner strings relative to the outer strings by: (1) applying an erase signal to both the inner strings and the outer strings from both a source side and a drain side of the inner strings and the outer strings, ending erasing inner strings and outer strings and returning the strings to ground, and applying an erase signal to the inner strings from the drain side to complete erase of the group of strings; or (2) applying an erase signal to energize the inner strings and the outer strings from the source side, applying an erase signal to inner strings from the drain side such that during an erase time period the inner strings are erased from energy from both the source side and the drain side, ending erase of both the inner strings and the outer strings to complete an erase cycle for both the inner strings and the outer strings.

These and other aspects of the present disclosure are disclosed in the following detailed description of the embodiments, the appended claims, and the accompanying figures.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

The present disclosure describes embodiments that provide for improved erase functions with a nonvolatile memory, e.g., vertical memory strings. Example embodiments described herein propose solutions to mitigate the string dependent erase issues associated with strings in vertically stacked three-dimensional (3D) memory structures. An example of such memory structures includes Bit Cost Scaling (BiCS) architecture, which can include expanding memory hole staggered patterns, e.g., 16-stagg or 20-stagg or more in two or more tiered vertical 3D NAND architectures. The presently disclosed structures can include a direct strap contact type of source line contact to the poly channel in BiCS. However, such architectures may introduce time consuming erase strings, e.g., some internally positioned strings may erase slower than other strings.

Example embodiment described herein can address such slow to erase strings. In an example, a selective erase of the strings from source and drain side can improve the erase function. An example solution erases all strings from both the source side and the drain side. Thereafter, only the inner strings are erases from the drain side. An example solution erases all strings from the source side and then erases the inner strings from the drain side. The inner strings may be the slow to erase strings. Hence, the inner strings receive an extra erase step to ensure they are erased without extending the erase function for all strings.

Figure 1:
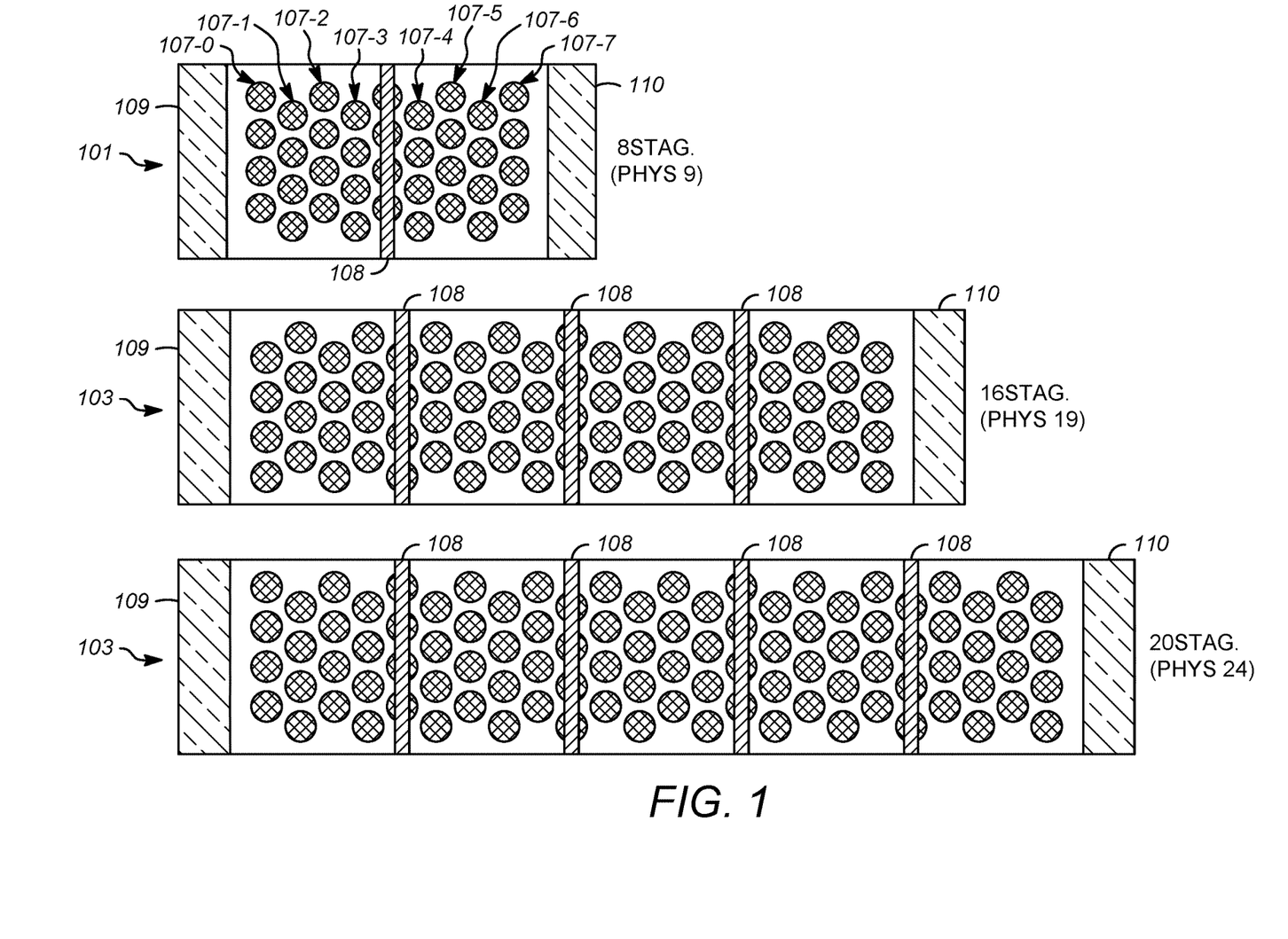
FIG. 1 shows a schematic view of three memory systems with staggered memory columns that can use the controlled erase functions as described herein.

FIG. 1 generally illustrates a schematic view of three versions of staggered string architecture 101, 103, 105 for BiCS memory, e.g., NAND. With reference the string architecture 101, the strings are shown in rows 107-0 through 107-7 in architecture 101. Each row is shown with four ends to the strings. A string may be connected to an adjacent string at an end (not visible beneath this view). A first group of rows 107-0 through 107-3 of shown on a left side of a dummy row 108. A second group of rows 107-4 through 107-7 of shown on a right side of the dummy row 108. The dummy row 108 separates the two groups of rows in the staggered eight row. A source line 109 is positioned at an edge of the first group and is remote from the dummy row 108. A source line 110 is positioned at an edge of the second group and is remote from the dummy row 108 and source line 109.

The staggered string architectures 103, 105 for BiCS memory are similar to that of architecture 101 except additional groups are added. Architecture 103 is double the size of architecture 101 and includes sixteen rows of strings with each group of four rows separated by a dummy row. Architecture 105 is larger than both the architecture 101 and the architecture 103. Architecture 105 includes twenty rows of strings with each group of four rows separated by a dummy row 108. It has been shown that the inner rows, e.g., 107-1, 107-2 and 107-5, 107-6, do not erase as efficiently as the outer rows e.g., 107-0, 107-3 and 107-4, 107-7. The present disclosure describes various methods and structures to efficiently erase the groups of strings when the inner rows of the strings erase differently than the outer rows of strings.

These architectures 101, 103, 105 can include a chip under array structure, e.g., the control circuitry is under the memory array that can include the groups of memory strings. With the chip under array structure, the strings may include a direct strap contact for the source line for read and erase operations.

Figure 2:
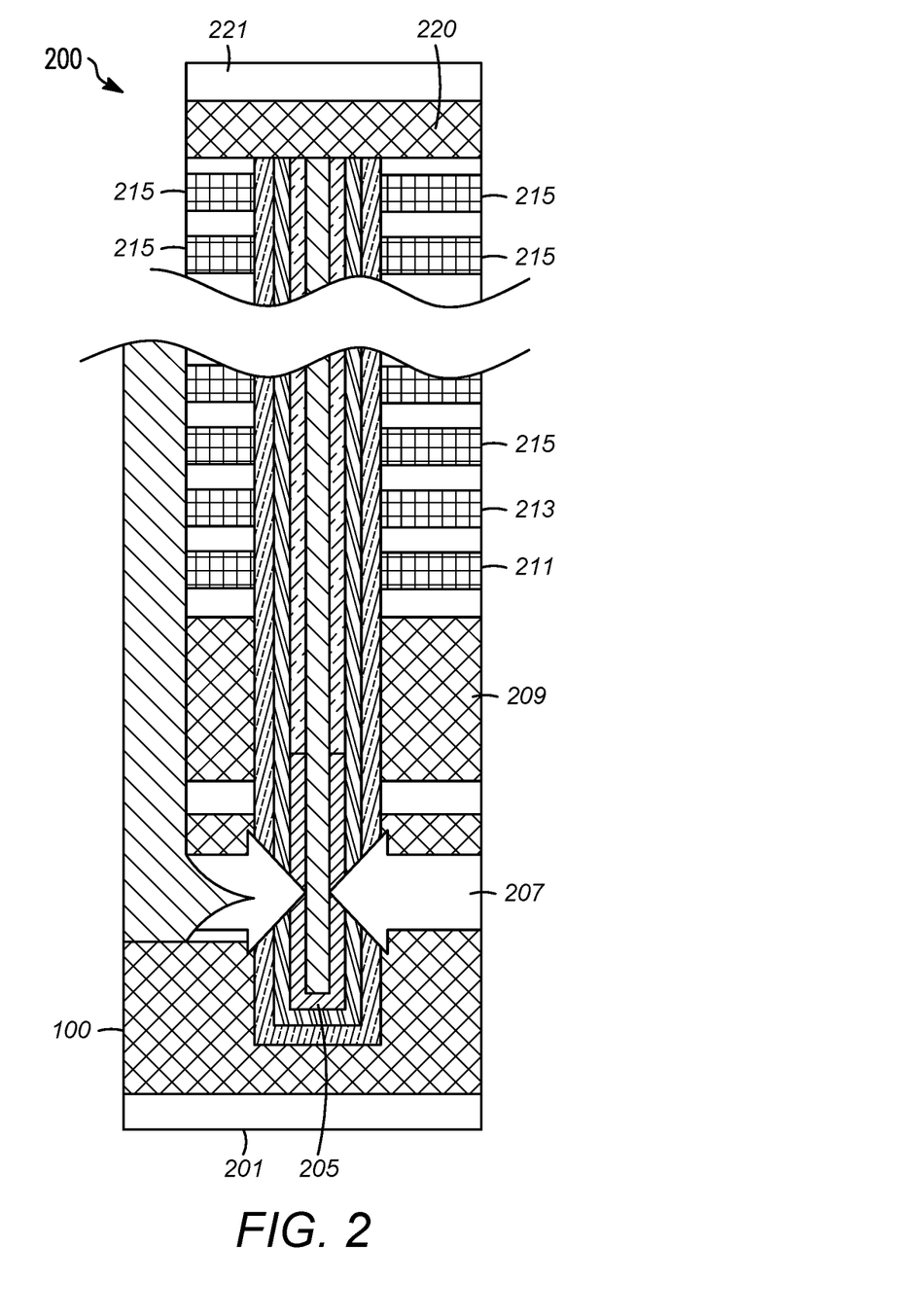
FIG. 2 shows a schematic cross sectional view of one of the vertical memory structures according to an aspect of the present disclosure.

FIG. 2 illustrates an example embodiment of a string 200 that can be used in vertical NAND memory structures. A base silicon layer 203 is provided at the bottom of the string. A chip under array 201 can be positioned under the string structure, e.g., under the base silicon layer 203. The chip under array 201 can include various circuitry required to operate the NAND memory, e.g., program, erase, and read operations. The circuitry in the chip under array 201 can include voltage sources, currently sources and control signals to the source gates, drain gates, word lines and bit lines to control access of memory cells. A direct strap connection 207 provides a connection for the source line during an erase operation, a program operation or a read operation. The direct strap connection 207 is in direct contact with the n+ doped region in the polysilicon channel at the bottom of the stand. The select gate source (SGSB) 209 is common to multiple strands and provides a selection to strands connected thereto. Additional select gates source (SGS0, SGS1, ...) 211, 213 are also connected at the bottom of the strand. The select gate sources can be transistors that include gates connected to the select gate lines. Above the select gate sources, a plurality of wordlines connect to series connected wordline transistors, which can act as memory cells along the strand. A select gate drain layer 220 is at the top of the string and can include a plurality of select gate drain transistors in series. A bit line layer 221 provides the connections to the strings above the select gate drain. The addition of the direct strap contact for the source line can introduce inefficiencies, e.g., during an erase operation.

In the source side gate induced leakage (GIDL) operation, an issue with erase operations has been found. The bits stored in the inner strings are slow to erase relative to those in the outer strings. It has been found that the slow erase bits are correlated with high SGSB Vt of the related strings. For example, the SGSB Vt can be more than 1.5 volts, 1.6 volts or more. This suggests that n+ dopants are under diffused in the channel region. Thus, the operation of the channel region cannot be controlled precisely for GIDL generation. Additionally, dopant in-diffusion or out-diffusion can occur due to high temperature thermal cycles in BiCS fabrication processes. In an example erase operation, wordline bits cannot be erased completely and the inner string bits are slow or un-erased. Applying a high SGSB voltage may help the erase but SGSB leakage will be a concern.

Alternately, increasing the number of erase loops may help to improve the inner versus outer strings erase discrepancy issues. But this introduces a performance penalty in terms of time and energy consumption. Additionally, the inner/outer strings erase disturb can occur due to strong erase stress compared to the outer string bits.

Presently described embodiments can assist in solving the string dependent erase issues in order to achieve cell reliability and performance of multiple string groupings that create multiple groups of inner strings. The issues may become more severe when the number of memory holes (i.e., strings, which are adjacent memory holes) are staggered (e.g. eight staggered architecture 101, sixteen staggered architecture 103 or twenty eight staggered architecture 105).

Figure 3A:
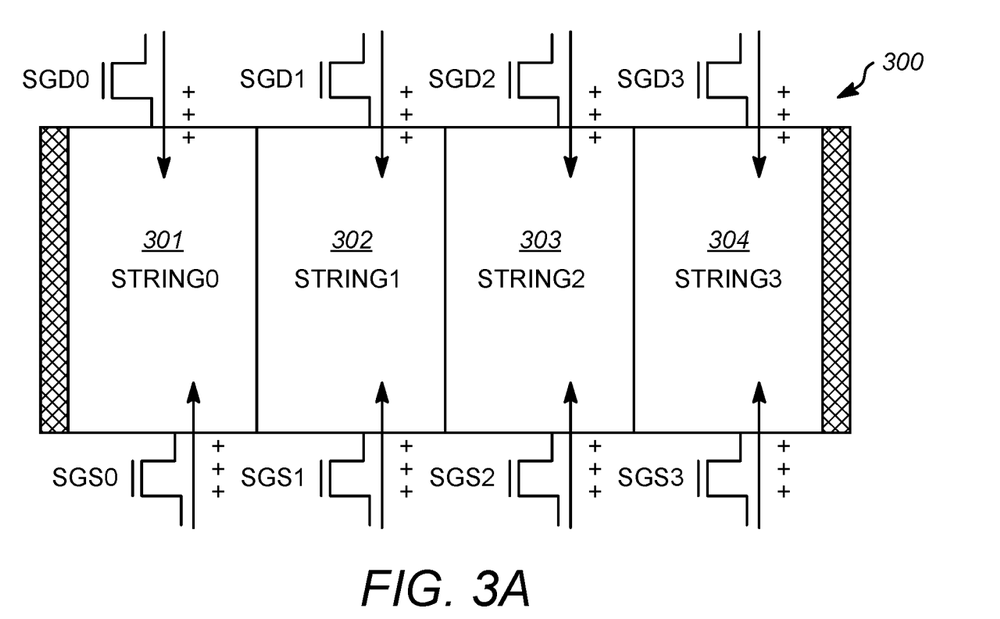
FIG. 3A shows a schematic view of a first step in an erase function for nonvolatile memory according to an aspect of the present disclosure.
Figure 3B:
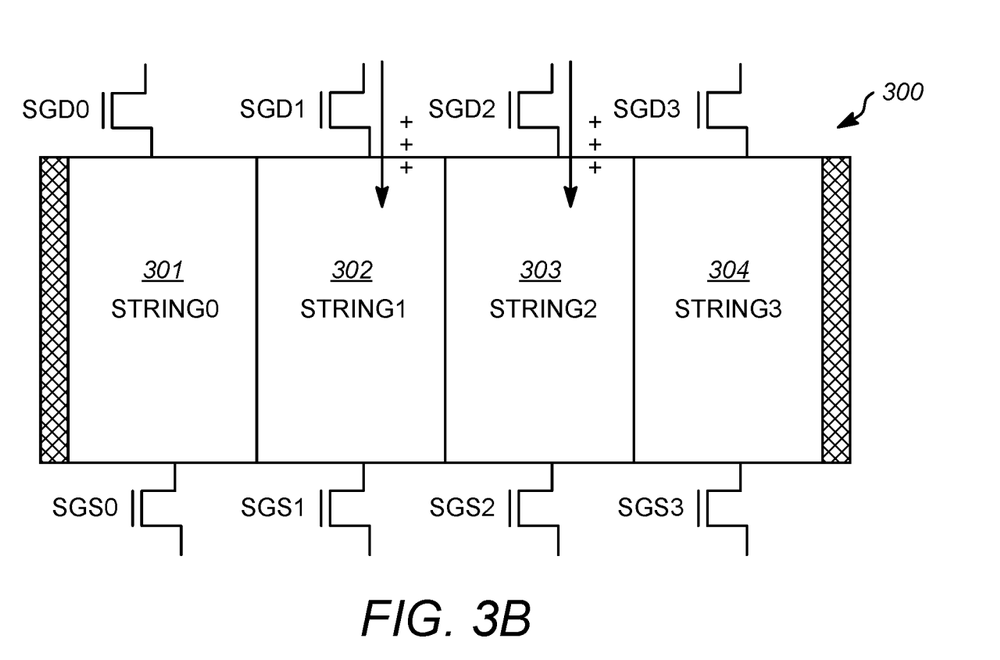
FIG. 3B shows a schematic view of a second step in an erase function for nonvolatile memory according to an aspect of the present disclosure.

FIGS. 3A and 3B illustrates an example of a scheme 300 for erasing a grouping of memory strings 301-304. FIG. 3A shows the first step in the erase operation, with each string being energized (e.g., moved to an energized state) from both the drain side (SGD0, SGD1, SGD2, SGD3) and the source side (SGS0, SGS1, SGS2, SGS3). An erase signal is supplied through each of the gate transistors. This operation will erase the cells in the outer strings 301, 304 (String0 and String3), but will not completely erase the cells in the inner strings 302, 303 (String1 and String2). Accordingly, a further operation is performed to erase the inner strings 302, 303.

Referring now to FIG. 3B, the inner strings 302, 303 are energized for an erase operation. The outer strings 301, 304 are not energized. In an example embodiment, the inner strings 302, 303 in this group are energized from the drain side (SGD1, SGD2) for an erase operation. In an example, the inner strings 302, 303 in this group are energized from both the drain side (SGD1, SGD2) and the source side (SGS1, SGS2) for an erase operation. The voltage level for at the drain side is the same as that of the energization in the first step shown in FIG. 3A.

Figure 4:
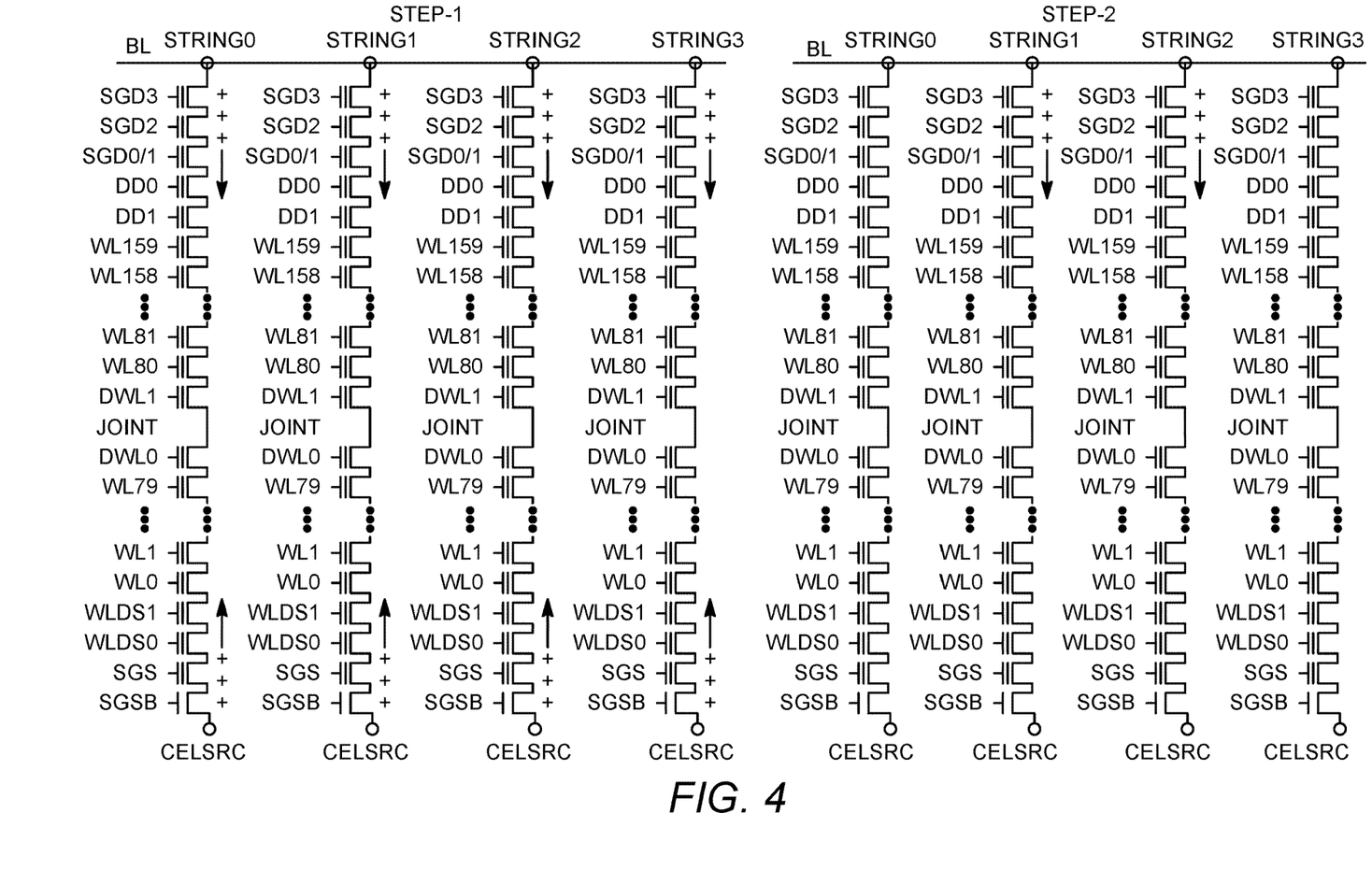
FIG. 4 shows a schematic view of memory strings during a first step and a second step of an erase function for nonvolatile memory according to an aspect of the present disclosure.

FIG. 4 illustrates a schematic views of steps 1 and 2 of the erase operation with additional detail with regard to the strings. The operation of Step-1 corresponds to that of FIG. 3A. The operation of Step-2 corresponds to that of FIG. 3.B. This view shows that the erase operation must erase a plurality of memory cells which are defined at each wordline, shown as 160 memory cells per string. The memory cells can be multibit cells. The direct strap connection would be adjacent the joint whereat the two strings extend vertically.

Figure 5:
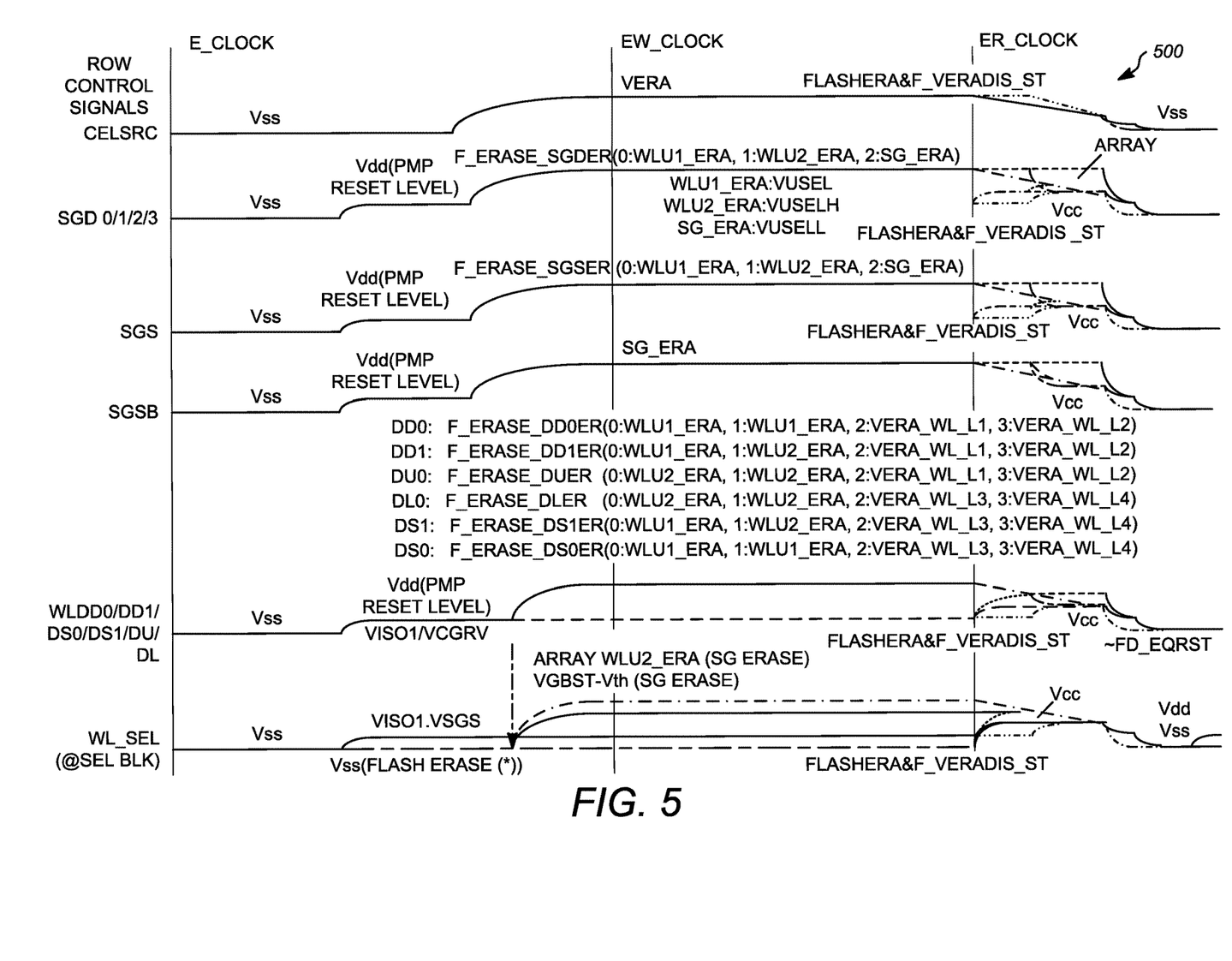
FIG. 5 is a timing diagram for operating a nonvolatile memory according to an aspect of the present disclosure.

FIG. 5 illustrates a control signal timing diagram 500 for the first step in the erase operation. As shown, the drain side signals SGD0, SGD1, SGD2, SGD3 are all high with the SGS and SGSB signals such that each string is energized from both the drain side and the source side. The CELSRC signal is high to supply the source side signal that is transmitted through the source gates to the string. Each of the high erase signals is greater than Vdd.

Figure 6:
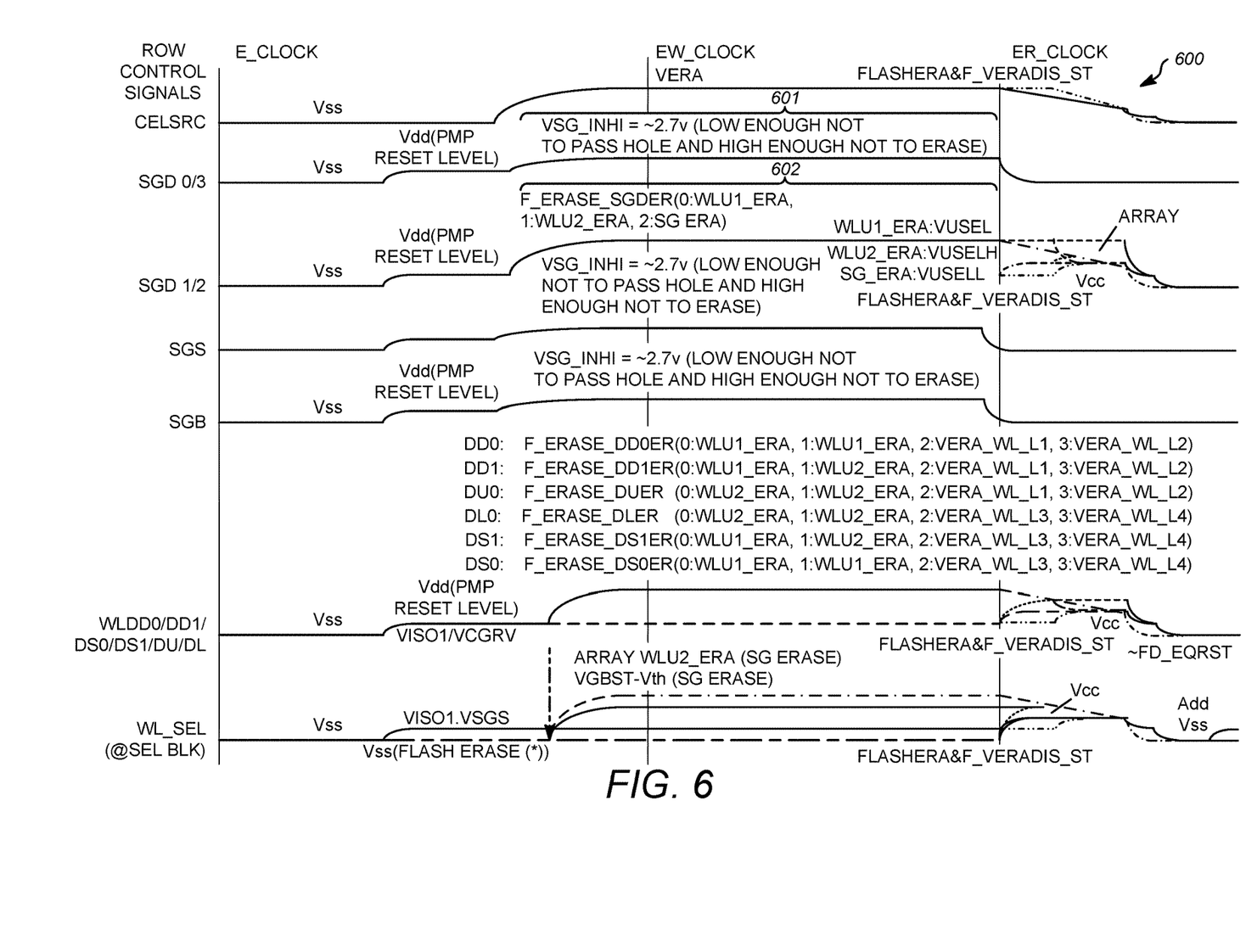
FIG. 6 is a timing diagram for operating a nonvolatile memory according to an aspect of the present disclosure.

FIG. 6 illustrates a control signal timing diagram 600 for the second step in the erase operation. The timing diagram 600 is similar to diagram 500 except the signals at the select gate drain for the outer strings (SGD0, SGD3) remains at a low level at 601 while the select gate drain for the inner strings (SGD1, SGD2) transitions to a high level (relative to SGD0, SGD3 at 602. This occurs over a same time period during EW_Clock. During the second step of the erase operation a different signal is applied to the inner strings through the drain side. Here, low voltage can be found at the drain side connected to the outer strings. This low voltage can be less than 2.7 volts so as to not pass hole and high enough to not erase.

Figure 7:
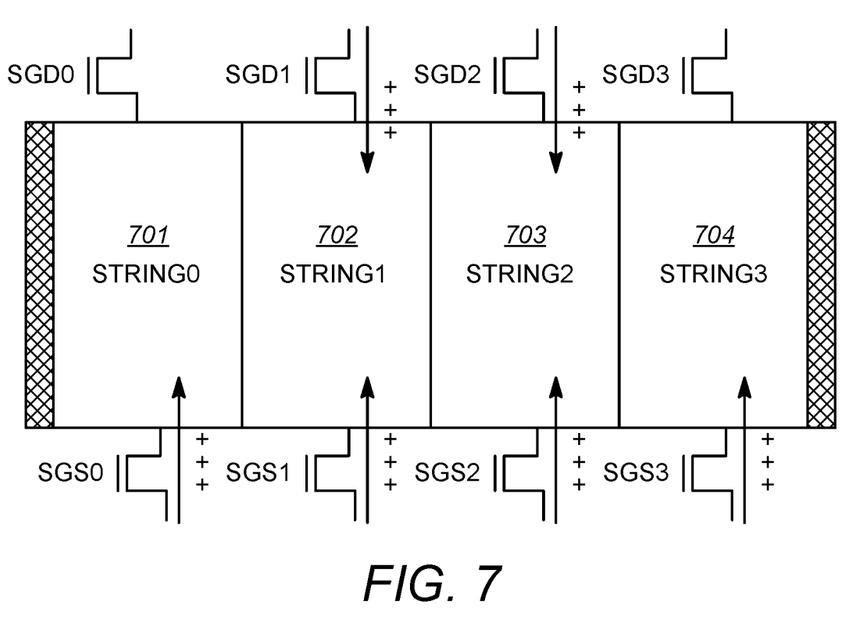
FIG. 7 shows a schematic view of an erase function for nonvolatile memory according to an aspect of the present disclosure.

FIG. 7 illustrates a further example of a scheme 700 for erasing a grouping of memory strings 701-704. The scheme 700 compensates for the slow erase or higher voltage requirement of the inner strings 702, 703 relative to the outer strings 701, 704 by applying an erase pulse signal to all strings 701-704 through the source side (SGS0, SGS1, SGS3, SGS3). The scheme 700 also applies an erase pulse signal to the inner strings 702, 702 through the drain gates SGD1, SGD2 but no erase signal is applied to the outer strings 701, 704. That is, no erase signal is applied through the gates SGD0, SGD3 to the outer strings 701, 704. While this may require a slightly longer time to apply the erase signals, there is no need to apply a second cycle of signals to this group of strings.

Figure 8:
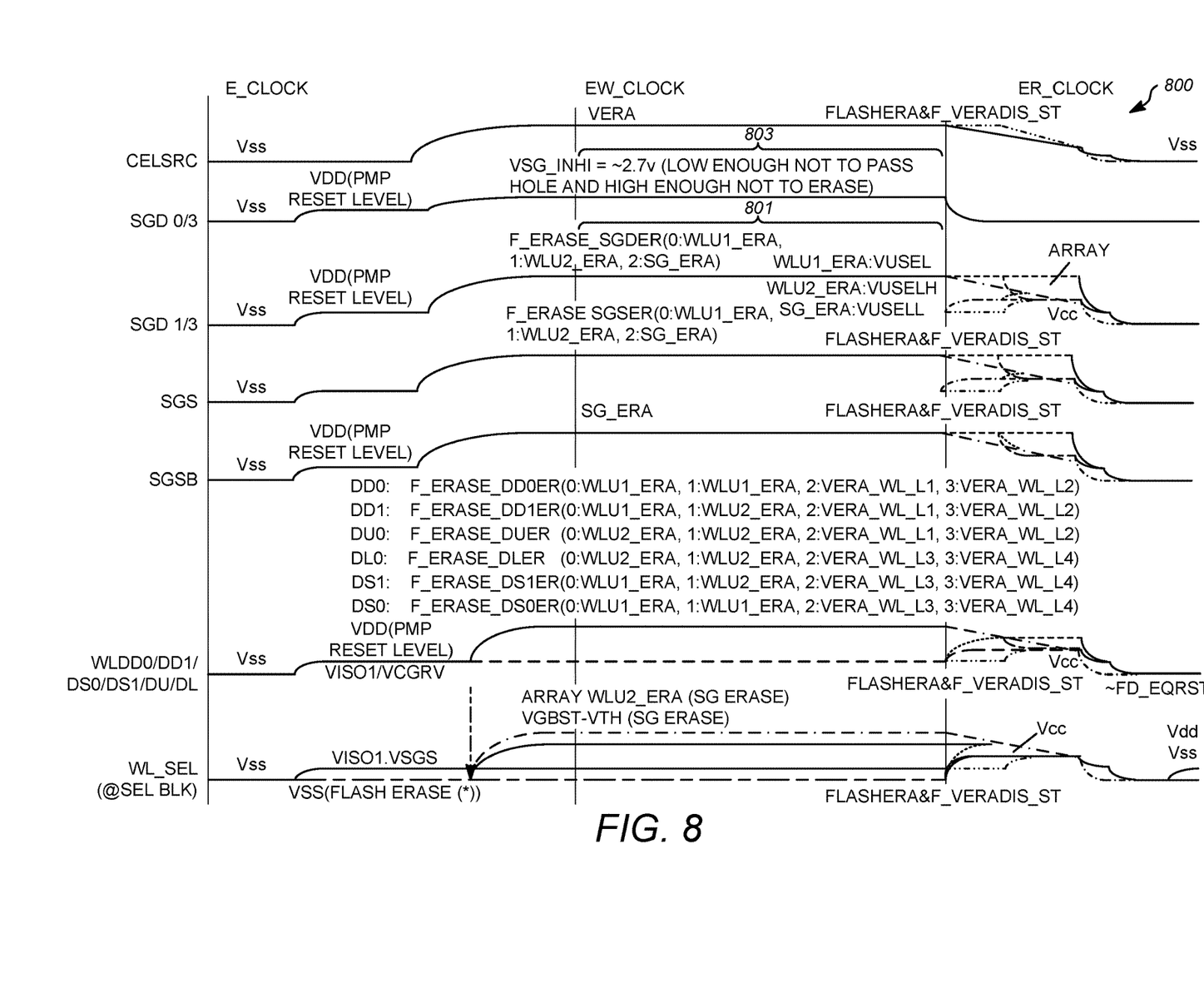
FIG. 8 is a timing diagram for operating a nonvolatile memory according to an aspect of the present disclosure.

FIG. 8 illustrates the control signal timing diagram 800 for the scheme 700. The signal level 801 applied to the inner strings 702, 703 during erase is higher than the signal level 803 applied to the outer strings 701, 704 during the erase.

Figure 9:
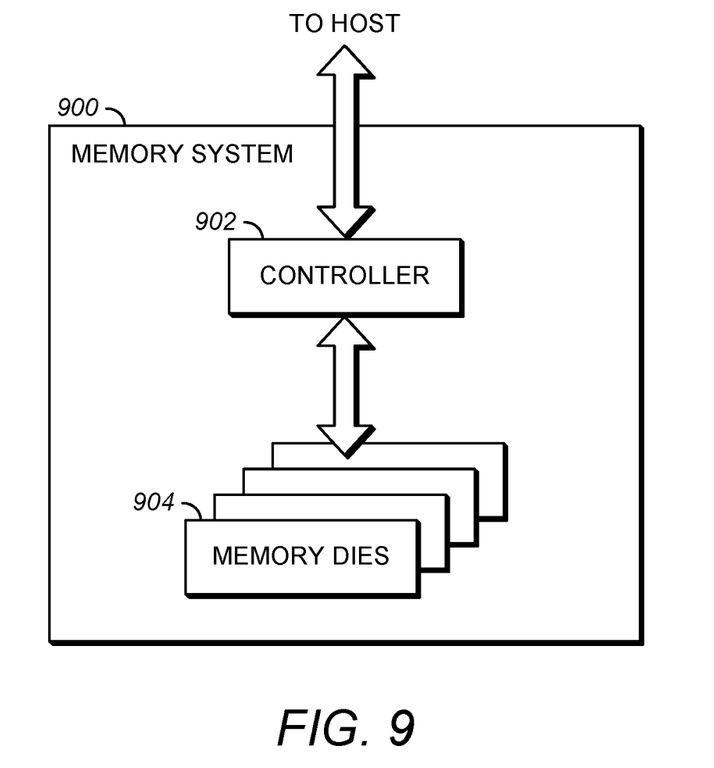
FIG. 9 generally illustrates a block diagram of an example memory system according to an aspect of the present disclosure.

FIG. 9 generally illustrates a block diagram illustrating a memory system 900. The memory system 900 may include a controller 902 and memory that may include or be made up of one or more memory dies 904. As used herein, the term die refers to the set of memory cells, and associated circuitry for managing the physical operation of those memory cells, that are formed on a single semiconductor substrate. The controller 902 may interface with a host system and transmit command sequences for read, program, and erase operations to the non-memory die(s) 904.

The controller 902 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 902 can be configured with hardware and/or firmware to perform the various functions described herein and generally illustrated in the timing diagrams. For example, the controller can control the erase verify signal levels and the soft erase signal levels on the odd and even wordlines in the non-volatile memory. Additionally, or alternatively, some of the components shown as being internal to the controller can also be stored external to the controller, and other components can be used. Additionally, or alternatively, the phrase "operatively in communication with" could mean directly in communication with or indirectly (wired or wireless) in communication with through one or more components, which may or may not be generally illustrated or described herein.

As used herein, the controller 902 is a device that manages data stored in the memory die(s) and communicates with a host, such as a computer or electronic device. The controller 902 can have various functionality in addition to the specific functionality described herein. For example, the controller 902 can format the memory dies 904 to ensure the memory dies 904 are operating properly, map out bad flash memory cells (e.g., by using the erase verify operations as described herein), and allocate spare cells to be substituted for future failed cells. Some part of the spare cells can be used to hold firmware to operate the controller 902 and implement other features. In operation, when a host needs to read data from or write data to the memory die(s) 904, the host will communicate with the controller 902. If the host provides a logical address to which data is to be read/written, the controller 902 can convert the logical address received from the host to a physical address in the memory die(s) 904. (Alternatively, the host can provide the physical address). The controller 902 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). The controller 902 can also control the erase verify operation as described herein. The memory die 904 includes the inhibit bit lines and the program bit lines as described herein.

The interface between the controller 902 and the non-volatile memory die(s) 904 may be any suitable interface, such as flash interface, including those configured for Toggle Mode 200, 400, 800, 1000 or higher. For some example embodiments, the memory system 900 may be a card-based system, such as a secure digital (SD) or a micro secure digital (micro-SD) card. In alternate example embodiments, the memory system 900 may be part of an embedded memory system.

In the example illustrated in FIG. 9, the memory system 900 is generally illustrated as including a single channel between the controller 902 and the non-volatile memory die(s) 904. However, the subject matter described herein is not limited to memory systems having a single memory channel. For example, in some memory systems, such as those embodying NAND architectures, 2, 4, 8 or more channels may exist between the controller 902 and the memory die(s) 904, depending on controller capabilities. In any of the embodiments described herein, more than a single channel may exist between the controller and the memory die(s) 904, even if a single channel is shown in the drawings.

Figure 10:
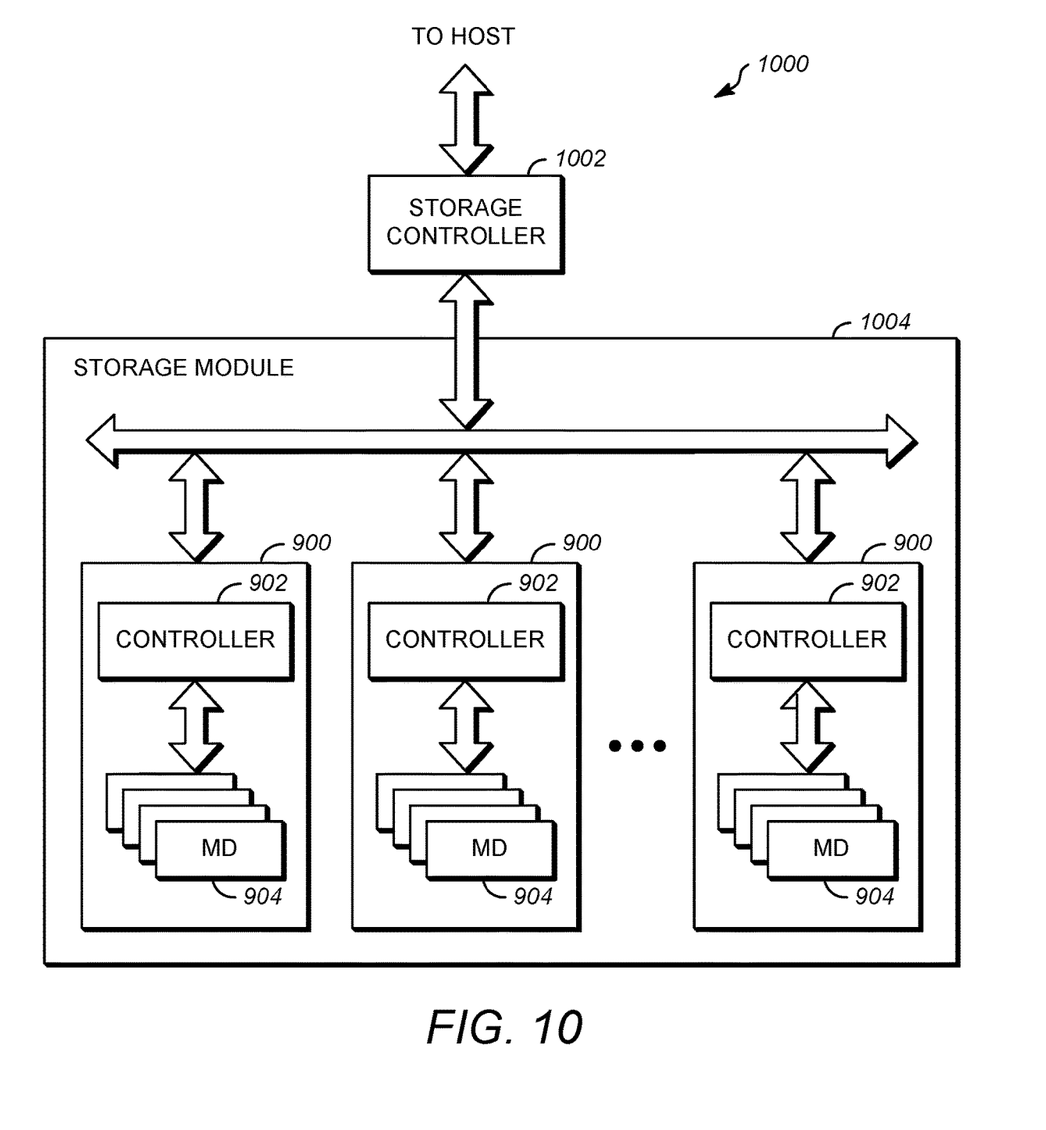
FIG. 10 generally illustrates a block diagram of an example storage module that includes a plurality of memory systems according to an aspect of the present disclosure.

FIG. 10 illustrates a storage module 1000 that includes a plurality of non-volatile memory systems 900. As such, the storage module 1000 may include a storage controller 1002 that interfaces with a host and with a storage system 1004, which includes a plurality of non-volatile memory systems 900. The interface between the storage controller 1002 and non-volatile memory systems 900 may be a bus interface, such as a serial advanced technology attachment (SATA), a peripheral component interface express (PCIe) interface, an embedded Multimedia Card (eMMC) interface, a SD interface, or a Universal Serial Bus (USB) interface, as examples.

The storage module 1000, in one embodiment, may be a solid-state drive (SSD), such as found in portable computing devices, such as laptop computers and tablet computers, and mobile phones.

Figure 11:
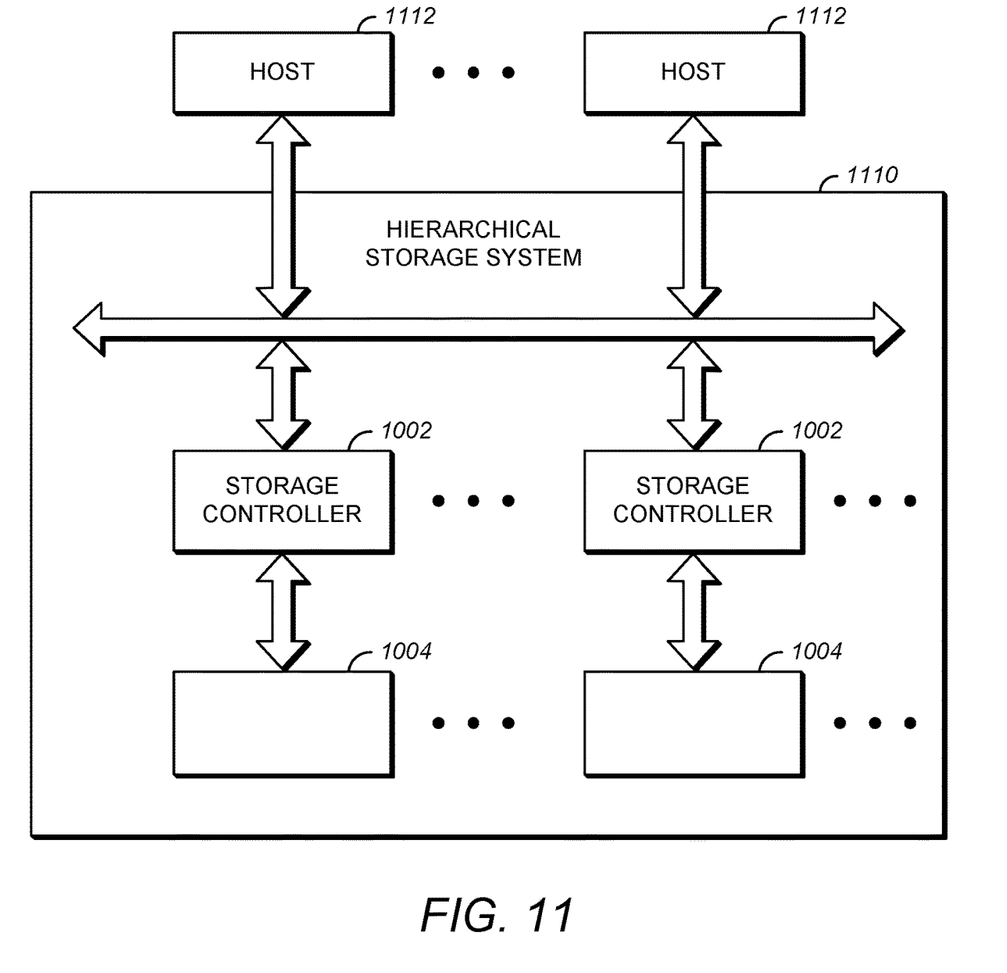
FIG. 11 generally illustrates a block diagram of an example hierarchical storage system.

FIG. 11 is a block diagram illustrating a hierarchical storage system 1110. The hierarchical storage system 1110 may include a plurality of storage controllers 1002, each of which control a respective storage system 1004. Host systems 1112 may access memories within the hierarchical storage system 1110 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 1110 illustrated in FIG. 11 may be a rack mountable mass storage system that is accessible by multiple host computers, such as would be found in a data center or other location where mass storage is needed.

The memory system as described herein may include a memory cell structure that includes a plurality of memory cells, otherwise or interchangeably referred to as memory elements. A memory cell is an element or component that stores a unit of data having an n-bit data value, where n is on or more. Any suitable type of memory can be used for the memory cells of the memory cell structure. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further, by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure of a memory die may be located within and/or over a substrate. The substrate may be a wafer over, in which the layer of the memory cells are formed, or it may be a carrier substrate, which is attached to the memory cells after they are formed. As a non-limiting example, the substrate may include a semiconductor and/or be made of a semiconductor material, such as silicon. A plurality of memory cells arranged in two dimensions is referred to as a two-dimensional (2-D) memory cell structure. A plurality of memory cells arranged in three dimensions is referred to as a three-dimensional (3-D) memory cell structure. In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate. As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the z direction) with each column having multiple memory cells in each column. The columns may be arranged in a two-dimensional configuration, e.g., in an x-y plane, resulting in a three-dimensional arrangement of memory cells, with the memory cells on multiple vertically stacked memory planes. Other configurations of memory cells in three dimensions can also constitute a three-dimensional memory array.

Additionally, or alternatively, the memory cells of a block or of the memory cell structure generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include two, three, or four, although MLC cells that store more than 4 bits may be possible. In general, certain collections of memory cells are configured to store the same number of bits. For example, memory cells that are part of the same word line cell group, part of the same block, or part of the same memory cell structure, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

The memory cells store data by being configured in memory states in NAND. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, the memory as described herein may include a power control circuit that is configured to generate and supply control line voltages (including voltage pulses) to control lines of the memory cell structures. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit also be configured to generate and/or supply voltages other than the control lines voltages, including other voltages that may be supplied to the memory cell structure, the read/write circuits, the sense blocks, and/or other circuit components on the memory die.

The memory devices that use the presently described systems and methodologies can provide an improved erase functions in NAND memory devices, e.g., those memories that use BiCS architecture. The strings extend in a vertical direction and can be staggered relative to adjacent rows strings. This allows the strands to be closer together. A direct strap contact (DSC) for a source line in which erase, program and read operations signals are sent. The DSC is directly contact with the n+ doped region of poly channel. For erase performance, both source side and drain side gate induced drain leakage (GIDL) are considered. In the source side GIDL operation, one issue has been found that bits from the inner strings are slow to erase. Investigation has indicated that those bits correlate with high SGSB Vt of the associated strings. This suggests that n+ dopants are under diffused in the channel region and it cannot be controlled precisely for GIDL generation. Additionally, dopants in-diffusion or out-diffusion are obvious due to high temperature thermal cycles in BiCS processes. Some wordlines cannot be erased completely and the inner string bits are slow or un-erased. The SGSB Vt of those strings are greater than 1.6V. Applying high SGSB voltage may help the erase but SGSB leak will be a concern. Alternately, increasing the erase loops (performance penalty) may help to improve the inner versus outer strings erase discrepancy issues, inner/outer strings erase disturb occur due to strong erase stress compared to the outer string bits. Examples described herein solve the string dependent erase issues in order to achieve cell reliability and performance of BiCS. Further, these issues are more severe when the number of memory holes stagger (ex., 8-stag to 16-stag or 20-stag) are increased in BiCS architectures. As described herein, solutions to solve the above issues are proposed. These should improve the performance and reliability of BiCS architectures and other multi-tier architectures.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

What is claimed is:

1. A non-volatile memory method, comprising:
   erasing inner strings and outer strings of a group of strings from both a source side and a drain side of the strings;
   end erasing inner strings and outer strings; and
   erasing inner strings of the group of strings from the drain side to complete erase of the group of strings.

2. The method of claim 1, wherein erasing all strings of a group of strings includes leaving slow-to-erase bits on the inner strings in a non-erase state.

3. The method of claim 2, wherein the slow bits in the inner strings are controlled by a higher select gate threshold voltage at a SGSB gate on the inner string greater than at an outer string SGSB gate.

4. The method of claim 3, wherein erasing inner strings of the group of strings includes inhibiting operating of the outer strings during erasing the inner strings.

5. The method of claim 4, wherein erasing inner strings of the group of strings from the drain side includes erasing inner strings of the group of strings from the drain side for upper tier wordlines and erasing inner strings of the group of strings from the source side for lower tier wordlines.

6. The method of claim 5, wherein the group of strings are staggered and have at least an eight staggered BiCs architecture.

7. The method of claim 6, wherein the BiCs architecture includes a direct strap contact region connected to a doped poly-channel region at a joint of the group of strings.

8. The method of claim 3, wherein the higher select gate threshold voltage at a SGSB gate is at least 1.2 volts.

9. The method of claim 1, wherein end erasing inner strings and outer strings includes holding SGD gates of the inner strings at a conducting state while driving source side for both the inner strings and outer strings to a non-biased state.

10. A non-volatile memory erase method comprising:
energizing inner strings and outer strings of a string group from a source side;
energizing inner strings of the string group from a drain side such that during an erase time period the inner strings are erased from energy from both the source side and the drain side;
ending erase of both the inner strings and the outer strings to complete an erase cycle for both the inner strings and the outer strings.

11. The method of claim 10, wherein slow bits in the inner strings are controlled by a higher select gate threshold voltage at a SGSB gate on the inner string greater than at an outer string SGSB gate.

12. The method of claim 10, wherein not applying an erase signal to the outer strings at through the gates at the source side.

13. The method of claim 10, wherein the group of strings are staggered and have at least an eight staggered BiCs architecture.

14. The method of claim 13, wherein the BiCs architecture includes a direct strap contact region connected to a doped poly-channel region at a joint of the group of strings.

15. The method of claim 10, wherein the energizing inner strings of the string group from a drain side forces a voltage level on the inner strings to be higher than a voltage level on the outer strings.

16. A NAND memory, comprising:
a group of inner strings and outer strings each with a direct strap contact for a source line;
control circuitry to supply erase signals to erase memory cells in the group of inner and outer strings, wherein the control circuitry is configured to apply different erase signals to the inner strings relative to the outer strings by
(1) applying an erase signal to both the inner strings and the outer strings from both a source side and a drain side of the inner strings and the outer strings, ending erasing inner strings and outer strings and return the strings to ground, and applying an erase signal to the inner strings from the drain side to complete erase of the group of strings; or
(2) applying an erase signal to energize the inner strings and the outer strings from the source side, applying an erase signal to inner strings from the drain side such that during an erase time period the inner strings are erased from energy from both the source side and the drain side, ending erase of both the inner strings and the outer strings to complete an erase cycle for both the inner strings and the outer strings.

17. The NAND memory of claim 16, wherein the group of inner and outer strings are staggered and have at least an eight staggered BiCs architecture.

18. The method of claim 17, wherein the BiCs architecture includes the direct strap contact region connected to a doped poly-channel region at a joint of the group of strings.

* * * * *